US012701906B2

(12) United States Patent
Hai et al.

(10) Patent No.: US 12,701,906 B2
(45) Date of Patent: Aug. 4, 2026

(54) DISPLAY SUBSTRATE AND DISPLAY APPARATUS

(71) Applicant: BOE Technology Group Co., Ltd., Beijing (CN)

(72) Inventors: Xiaoquan Hai, Beijing (CN); Yingzi Wang, Beijing (CN); Xiaochuan Chen, Beijing (CN); Xue Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 272 days.

(21) Appl. No.: 18/681,496

(22) PCT Filed: Nov. 22, 2021

(86) PCT No.: PCT/CN2021/132156
§ 371 (c)(1),
(2) Date: Feb. 5, 2024

(87) PCT Pub. No.: WO2023/087322
PCT Pub. Date: May 25, 2023

(65) Prior Publication Data
US 2024/0341161 A1     Oct. 10, 2024

(51) Int. Cl.
*H10K 59/80*      (2023.01)
*H10K 39/34*      (2026.01)
*H10K 59/35*      (2023.01)

(52) U.S. Cl.
CPC ......... *H10K 59/8792* (2023.02); *H10K 39/34* (2023.02); *H10K 59/353* (2023.02)

(58) Field of Classification Search
CPC ...... H10K 39/34; H10K 59/65; H10K 59/126; H10K 59/353; H10K 59/8792
See application file for complete search history.

(56) References Cited

U.S. PATENT DOCUMENTS

| | | | |
|---|---|---|---|
| 2019/0294850 A1 | 9/2019 | Cao et al. | |
| 2020/0134284 A1 | 4/2020 | Ling et al. | |
| (Continued) | | | |

FOREIGN PATENT DOCUMENTS

| | | |
|---|---|---|
| CN | 106980842 A | 7/2017 |
| CN | 107368822 A | 11/2017 |
| (Continued) | | |

OTHER PUBLICATIONS

PCT/CN2021/132156 international search report dated Aug. 8, 2022.

*Primary Examiner* — Fazli Erdem
(74) *Attorney, Agent, or Firm* — IPro, PLLC

(57) ABSTRACT

Disclosed are a display substrate and a display apparatus. The display substrate includes the photosensitive devices, a noise reduction layer, the light-emitting devices and a black matrix are sequentially arranged, where the black matrix does not shield the light-emitting devices, the black matrix includes the first openings, which are located in at least some gaps of the light-emitting devices and correspond to the photosensitive devices, and an orthographic projection of each first opening is located in an orthographic projection of each photosensitive device; an orthographic projection of the noise reduction layer at least overlaps with orthographic projections of the photosensitive devices, and the noise reduction layer is provided with the second openings, orthographic projections of which are located in the orthographic projections of the photosensitive devices; and each photosensitive device, each first opening and each second opening satisfy the following relational expressions: $d=X*D_1$, $D_2=K*D_1$, and $d=D_1-(D_1+D_2)*h_1/(h_1+h_2+h)$.

20 Claims, 15 Drawing Sheets

(56)         References Cited

U.S. PATENT DOCUMENTS

| | | | |
|---|---|---|---|
| 2021/0357606 A1 | 11/2021 | Cao et al. | |
| 2021/0366966 A1 | 11/2021 | Li et al. | |
| 2021/0376003 A1 * | 12/2021 | Xu | G06F 3/0412 |
| 2022/0067326 A1 | 3/2022 | Wang et al. | |
| 2022/0271098 A1 * | 8/2022 | Xu | G06V 40/1318 |
| 2022/0271103 A1 * | 8/2022 | Hai | G06V 10/147 |
| 2023/0354624 A1 | 11/2023 | Song et al. | |
| 2024/0312241 A1 * | 9/2024 | Hai | G06V 40/1318 |

FOREIGN PATENT DOCUMENTS

| | | | |
|---|---|---|---|
| CN | 108256507 A | 7/2018 |
| CN | 108807487 A | 11/2018 |
| CN | 110427931 A | 11/2019 |
| CN | 111564506 A | 8/2020 |
| CN | 112001337 A | 11/2020 |
| CN | 112748598 A | 5/2021 |

* cited by examiner

DISPLAY SUBSTRATE AND DISPLAY APPARATUS

CROSS-REFERENCE TO RELATED APPLICATIONS

The application is a National Stage of International Application No. PCT/CN2021/132156, filed Nov. 22, 2021.

TECHNICAL FIELD

The disclosure relates to the field of display technology, and in particular to a display substrate and a display apparatus.

BACKGROUND

With the rapid development of the information industry, the biometric recognition technology has been increasingly widely used. In particular, different users have different fingerprints, facilitating confirmation of user identity, so the fingerprint recognition technology has been widely used in mobile terminals, smart homes and other fields, to provide security for user information.

The optical fingerprint recognition is one of means to achieve fingerprint recognition. The principle of the optical fingerprint recognition is as follows: when a finger is placed above a display product, the light emitted from the light source included in the display product strikes valleys and ridges of the finger, is reflected by the valleys and ridges of the finger, and then the reflected light enters a photosensitive device included in the display product. Since the reflected light at the valleys and ridges have different intensities, the photosensitive device generates different electrical signals based on the difference between the above intensities of the reflected light, to realize the fingerprint recognition.

SUMMARY

Embodiments of the present disclosure provide a display substrate and a display apparatus, and the specific solution is as follows.

In one aspect, an embodiment of the present disclosure provides a display substrate, including:

a base substrate;

a plurality of light-emitting devices, arranged in an array on the base substrate;

a black matrix, arranged on a side of a layer where the plurality of light-emitting devices are located facing away from the base substrate, where an orthographic projection of the black matrix on the base substrate does not overlap with orthographic projections of the plurality of light-emitting devices on the base substrate, the black matrix includes a plurality of first openings, and orthographic projections of the plurality of first openings on the base substrate are located within orthographic projections of at least part of gaps between the plurality of light-emitting devices on the base substrate;

a plurality of photosensitive devices, arranged between the layer where the plurality of light-emitting devices are located and the base substrate, where orthographic projections of the plurality of photosensitive devices on the base substrate are located within the orthographic projections of at least part of gaps between the plurality of light-emitting devices on the base substrate, and the orthographic projections of the plurality of first openings on the base substrate are located within the orthographic projections of the plurality of photosensitive devices on the base substrate;

a noise reduction layer, arranged between a layer where the plurality of photosensitive devices are located and light emitting surfaces of the plurality of light-emitting devices, where an orthographic projection of the noise reduction layer on the base substrate at least overlaps with the orthographic projections of the plurality of photosensitive devices on the base substrate, the noise reduction layer includes a plurality of second openings, and orthographic projections of the plurality of second openings on the base substrate are located within the orthographic projections of the plurality of photosensitive devices on the base substrate;

where each of the plurality of photosensitive devices, each of the plurality of first openings, and each of the plurality of second openings satisfy following relationships:

$$d = X*D_1,$$
$$D_2 = K*D_1,$$
$$\text{and } d = D_1 - (D_1 + D_2)*h_1/(h_1 + h_2 + h);$$

where d represents an aperture of the second opening, $D_1$ represents a side length of an orthographic projection of a photoelectric conversion layer included in the photosensitive device on the base substrate, $D_2$ represents an aperture of the first opening, $h_1$ represents a distance between a surface of a side of the photosensitive device facing away from the base substrate and a surface of a side of the noise reduction layer facing the base substrate, $h_2$ represents a distance between a surface of a side of the noise reduction layer facing away from the base substrate and a surface of a side of the black matrix facing the base substrate, h represents a thickness of the noise reduction layer in a direction perpendicular to the base substrate, X is greater than 0 and less than or equal to 0.6, and K is greater than 0.7 and less than or equal to 1.

In some embodiments, in the above display substrate according to embodiments of the present disclosure, the orthographic projections of the plurality of photosensitive devices on the base substrate are located within orthographic projections of at least part of column gaps between the plurality of light-emitting devices on the base substrate.

In some embodiments, in the above display substrate according to embodiments of the present disclosure, the plurality of light-emitting devices include a plurality of first light-emitting devices, a plurality of second light-emitting devices, and a plurality of third light-emitting devices, and a light emitting color of the plurality of first light-emitting devices, a light emitting color of the plurality of second light-emitting devices, and a light emitting color of the plurality of third light-emitting devices are different;

the first light-emitting device, the second light-emitting device, and the third light-emitting device are circularly arranged in a row direction, two adjacent light-emitting devices of a same color in a same row are spaced by (n−1) light-emitting devices, where N is a total number of light emitting colors;

the orthographic projections of the plurality of photosensitive devices on the base substrate are located within orthographic projections of all column gaps at two sides of each of the plurality of second light-emitting devices on the base substrate.

In some embodiments, in the above display substrate according to embodiments of the present disclosure, a bottom electrode of the photosensitive device includes a first subsection and a second subsection which are integrally arranged;

where the first subsection and the second subsection respectively extend along the column direction;

a width of the first subsection in the row direction is greater than a width of the second subsection in the row direction, and a side of the first subsection away from the second light-emitting device and a side of the second subsection away from the second light-emitting device are located on a same straight line.

In some embodiments, in the above display substrate according to embodiments of the present disclosure, the bottom electrode of the photosensitive device further includes a third subsection at a column gap between the second light-emitting device and the first light-emitting device, the third subsection is integrally arranged with the second subsection at an end away from the first subsection, and the third subsection extends along the row direction.

In some embodiments, in the above display substrate according to embodiments of the present disclosure, the display substrate further includes: a plurality of transistors, where the plurality of transistors are arranged between the layer where the plurality of photosensitive devices are located and the base substrate;

a first electrode of each of the transistors is electrically connected with the third subsection at the column gap between the second light-emitting device and the first light-emitting device, and the second subsection at the column gap between the second light-emitting device and the third light-emitting device, in one-to-one correspondence.

In some embodiments, in the above display substrate according to embodiments of the present disclosure, a shape of an orthographic projection of the first electrode of the transistor on the base substrate includes a first octagon, a second octagon, and a rectangle connected with the first octagon and the second octagon; where the first octagon is electrically connected with the bottom electrode of the photosensitive device, and the second octagon is electrically connected with an active layer of the transistor.

In some embodiments, in the above display substrate according to embodiments of the present disclosure, the plurality of transistors are arranged in an array on the base substrate; active layers of the plurality of transistors in a same row are located on a same straight line, and active layers of the plurality of transistors in a same column are arranged in parallel.

In some embodiments, in the above display substrate according to embodiments of the present disclosure, the light emitting color of the plurality of first light-emitting devices is blue, the light emitting color of the plurality of second light-emitting devices is green, and the light emitting color of the plurality of third light-emitting devices is red.

In some embodiments, in the above display substrate according to embodiments of the present disclosure, the display substrate further includes a plurality of bias lines, where the plurality of bias lines and anodes of the plurality of light-emitting devices are arranged in a same layer, and there are gaps are arranged between the bias lines and the anodes of the plurality of light-emitting devices.

In some embodiments, in the above display substrate according to embodiments of the present disclosure, orthographic projections of the plurality of bias lines on the base substrate are located at row gaps between the plurality of light-emitting devices, and one of the plurality of bias lines is electrically connected with a top electrode of the photosensitive device in a same row.

In some embodiments, in the above display substrate according to embodiments of the present disclosure, the plurality of bias lines are lines with a wavy shape.

In some embodiments, in the above display substrate according to embodiments of the present disclosure, the display substrate further includes a pixel defining layer, where the pixel defining layer is arranged between a layer where anodes of the plurality of light-emitting devices are located and light emitting functional layers of the plurality of light-emitting devices, and the pixel defining layer is multiplexed as the noise reduction layer.

In some embodiments, in the above display substrate according to embodiments of the present disclosure, the display substrate further includes a planarization layer, where the planarization layer is arranged between the layer where the plurality of light-emitting devices are located and the layer where the plurality of photosensitive devices are located, and the planarization layer is multiplexed as the noise reduction layer.

In some embodiments, in the above display substrate according to embodiments of the present disclosure, the noise reduction layer and anodes of the plurality of light-emitting devices are arranged in a same layer;

the noise reduction layer includes a plurality of noise reduction portions, each of the plurality of noise reduction portions is arranged correspondingly to one of the plurality of photosensitive devices, and each of the plurality of noise reduction portions includes one of the plurality of second openings;

an orthographic projection of one noise reduction portion on the base substrate is larger than an orthographic projection of the photosensitive device corresponding to the one noise reduction portion on the base substrate, and gaps are arranged between the plurality of noise reduction portions and the anodes of the plurality of light-emitting devices.

In some embodiments, in the above display substrate according to embodiments of the present disclosure, the plurality of photosensitive devices, the plurality of first openings and the plurality of second openings are arranged in one-to-one correspondence.

In some embodiments, in the above display substrate according to embodiments of the present disclosure, an orthographic projection of a center of one photosensitive device on the base substrate, an orthographic projection of a center of one first opening on the base substrate, and an orthographic projection of a center of one second opening on the base substrate substantially coincide with each other.

In some embodiments, in the above display substrate according to embodiments of the present disclosure, orthographic projections of photoelectric conversion layers of the plurality of photosensitive devices on the base substrate, the orthographic projections of the plurality of first openings on the base substrate, and the orthographic projections of the plurality of second openings on the base substrate are all rectangles.

In some embodiments, in the above display substrate according to embodiments of the present disclosure, $D_1$ is greater than or equal to 8 μm and less than or equal to 20 μm, $h_1$ is greater than or equal to 2 μm and less than or equal to 6 µm, $h_2$ is greater than or equal to 10 µm and less than or equal to 20 µm, and h is greater than or equal to 1 µm and less than or equal to 2 µm.

In another aspect, an embodiment of the present disclosure provides a display apparatus, including the above-mentioned display substrate according to embodiments of the present disclosure.

DETAILED DESCRIPTION

Figure 1:
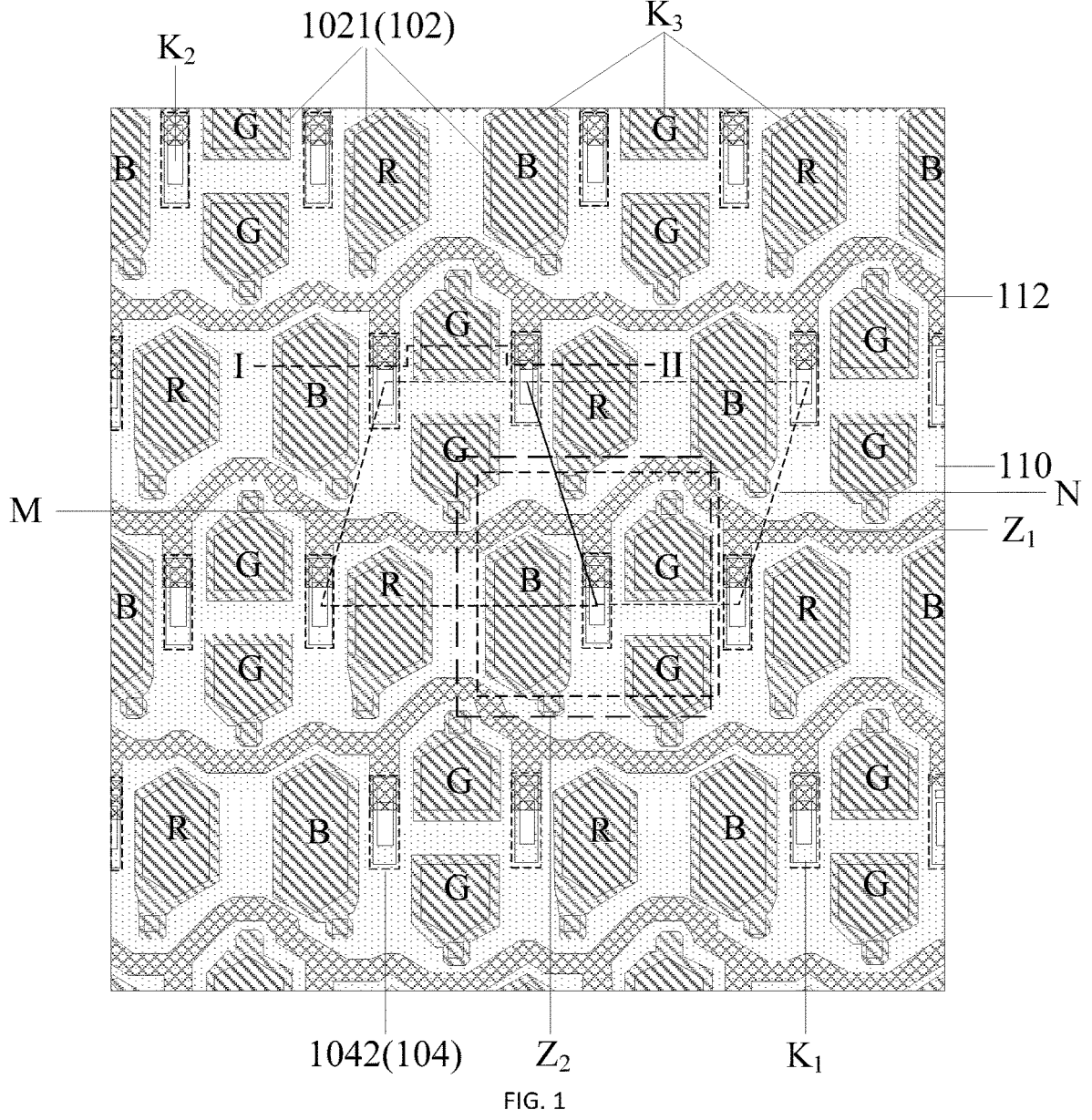
FIG. 1 is a schematic structural diagram of a display substrate provided by an embodiment of the present disclosure.

In order to make the purpose, technical solutions and advantages of embodiments of the present disclosure more clear, the technical solutions of embodiments of the present disclosure will be clearly and completely described below in conjunction with the drawings of embodiments of the present disclosure. It should be noted that the size and shape of each figure in the drawings do not reflect the true scale, but are only intended to illustrate the present disclosure. The same or similar reference numerals represent the same or similar elements or elements having the same or similar functions throughout. Obviously, the described embodiments are some, but not all, of embodiments of the present disclosure. Based on the described embodiments of the present disclosure, all other embodiments obtained by those of ordinary skill in the art without creative efforts fall within the scope of protection of the present disclosure.

Unless otherwise defined, technical or scientific terms used here shall have their ordinary meaning understood by a person of ordinary skill in the art to which this disclosure belongs. "First", "Second" and similar words used in the description and claims in the disclosure do not indicate any order, quantity or importance, but are only used to distinguish different components. Words such as "include" or "comprise" mean that the elements or things appearing before the word include the elements or things listed after the word and their equivalents, without excluding other elements or things. "Inner", "outer", "up", "down", etc., are only used to express relative positional relationships. When the absolute position of the described object changes, the relative positional relationship may also change accordingly.

Detailed descriptions of known functions and known components are omitted from the present disclosure in order to keep the following description of the embodiments of the present disclosure clear and concise.

In an Organic Light emitting Diode (OLED), in a scheme that a color film (CF) is directly fabricated on an encapsulation layer (TFE) (Color Film On Encapsulation, COE), a polarizer may be replace by the color film, so that that OLED display apparatus has characteristics of high integration level, lighter weight and higher transmittance. Therefore, compared with a product adopting the polarizer, power consumption of the display apparatus can be reduced by about 20%, the service life of the display apparatus can be prolonged by about 40%, and the display apparatus is more suitable for 5G products with high speed and low delay.

However, in an OLED display apparatus in which a color film and a photosensitive device are integrated, a total luminous flux received by the photosensitive device includes a valley/ridge luminous flux (i.e., reflected light from a fingerprint), other luminous fluxes such as stray light, and a reflected luminous flux of a film layer (such as an encapsulation layer, a touch layer and the like) between a light-emitting device and a protective cover plate. That is, the valley/ridge luminous flux actually carrying the fingerprint characteristic signal only accounts for a part of the total luminous flux, so that a proportion of valleys and ridges luminous flux in the total luminous flux received by the photosensitive device is low, which leads to reduction of fingerprint identification accuracy. The proportion of valleys and ridges luminous flux is a ratio of a difference between a valley luminous flux and a ridge luminous flux received by the photosensitive device to a total luminous flux for a single photosensitive device. Furthermore, the photosensitive device has a limit of full well capacity (analogous to a water tank, which has an upper limit of capacity). Therefore, increasing the intensity of the light source cannot indirectly increase the proportion of valleys and ridges luminous flux.

In order to address the above-mentioned technical problems existing in the related art, embodiments of the present disclosure provide a display substrate, as shown in FIG. 1 to FIG. 5, including:

a base substrate 101;

a plurality of light-emitting devices 102, arranged in an array on the base substrate 101; where the light-emitting device 102 may include an anode 1021, a light emitting function layer 1022 and a cathode 1023 which are stacked, the light emitting functional layer 1022 includes, but is not limited to, a hole injection layer, a hole transport layer, an electron blocking layer, a light emitting material layer, a hole blocking layer, a hole transport layer and an electron injection layer;

a black matrix 103, arranged on a side of a layer where the plurality of light-emitting devices 102 are located facing away from the base substrate 101, where an orthographic projection of the black matrix 103 on the base substrate 101 does not overlap with orthographic projections of the plurality of light-emitting devices 102 on the base substrate 101, the black matrix 103 includes a plurality of first openings $K_1$, and orthographic projections of the plurality of first openings $K_1$ on the base substrate 101 are located within orthographic projections of at least part of gaps between the light-emitting devices 102 on the base substrate 101; generally, the black matrix 103 further includes openings K' for setting color resistances CF, and the openings K' are located directly above the light-emitting devices 102;

a plurality of photosensitive devices 104, arranged between the layer where the plurality of light-emitting devices 102 are located and the base substrate 101, where orthographic projections of the plurality of photosensitive devices 104 on the base substrate 101 are located within orthographic projections of at least part of gaps between the light-emitting devices 102 on the base substrate 101, and the orthographic projections of the plurality of first openings $K_1$ on the base substrate 101 are located within the orthographic projections of the plurality of photosensitive devices 104 on the base substrate 101; the photosensitive device 104 may include a bottom electrode 1041, a photoelectric conversion layer 1042 and a top electrode 1043 which are stacked, where the photoelectric conversion layer 1042 may have a PIN structure, which may include a P-type semiconductor layer, an I-type semiconductor layer (also referred to as an intrinsic semiconductor layer), and an N-type semiconductor layer; where the P-type semiconductor layer is arranged between the bottom electrode 1041 and the I-type semiconductor layer, and the N-type semiconductor layer is arranged between the I-type semiconductor layer and the top electrode 1043; alternatively, the N-type semiconductor layer is arranged between the bottom electrode 1041 and the I-type semiconductor layer, and the P-type semiconductor layer is arranged between the I-type semiconductor layer and the top electrode 1043, which is not limited herein;

a noise reduction layer 105, arranged between a layer where the plurality of photosensitive devices 104 are located and light emitting surfaces of the plurality of light-emitting devices 102, where an orthographic projection of the noise reduction layer 105 on the base substrate 101 at least overlaps with the orthographic projections of the plurality of photosensitive devices 104 on the base substrate 101, the noise reduction layer 105 includes a plurality of second openings $K_2$, and orthographic projections of the plurality of second openings $K_2$ on the base substrate 101 are located within the orthographic projections of the plurality of photosensitive devices 104 on the base substrate 101;

where the photosensitive device 104, the first opening $K_1$, and the second opening $K_2$ satisfy following relationships:

$$d = X * D_1; \quad (1)$$

-continued $$D_2 = K * D_1; \quad (2)$$

$$d = D_1 - (D_1 + D_2) * h_1/(h_1 + h_2 + h); \quad (3)$$

where d represents an aperture of the second opening $K_2$, $D_1$ represents a side length of an orthographic projection of a photoelectric conversion layer included in the photosensitive device 104 on the base substrate 101, $D_2$ represents an aperture of the first opening $K_1$, $h_1$ represents a distance between a surface of a side of the photosensitive device 104 facing away from the base substrate 101 and a surface of a side of the noise reduction layer 105 facing the base substrate 101, $h_2$ represents a distance between a surface of a side of the noise reduction layer 105 facing away from the base substrate 101 and a surface of a side of the black matrix 103 facing the base substrate 101, h represents a thickness of the noise reduction layer 105 in a direction perpendicular to the base substrate 101, X is greater than 0 and less than or equal to 0.6, and K is greater than 0.7 and less than or equal to 1.

In the display substrate provided by embodiments of the present disclosure, by sequentially arranging the second opening $K_2$ and the first opening $K_1$ on a light incident side of the photosensitive device 104, and making the photosensitive device 104, the first opening $K_1$, and the second opening $K_2$ satisfy the above relational expressions (1) to (3), reflected light from a film layer (e.g., the encapsulation layer 107, the touch layer 108, etc.) between the light-emitting device 102 and the protective cover plate 106 can be effectively avoided to be irradiated to the photosensitive device 104, effectively increasing the proportion of valleys and ridges luminous flux.

Figure 6:
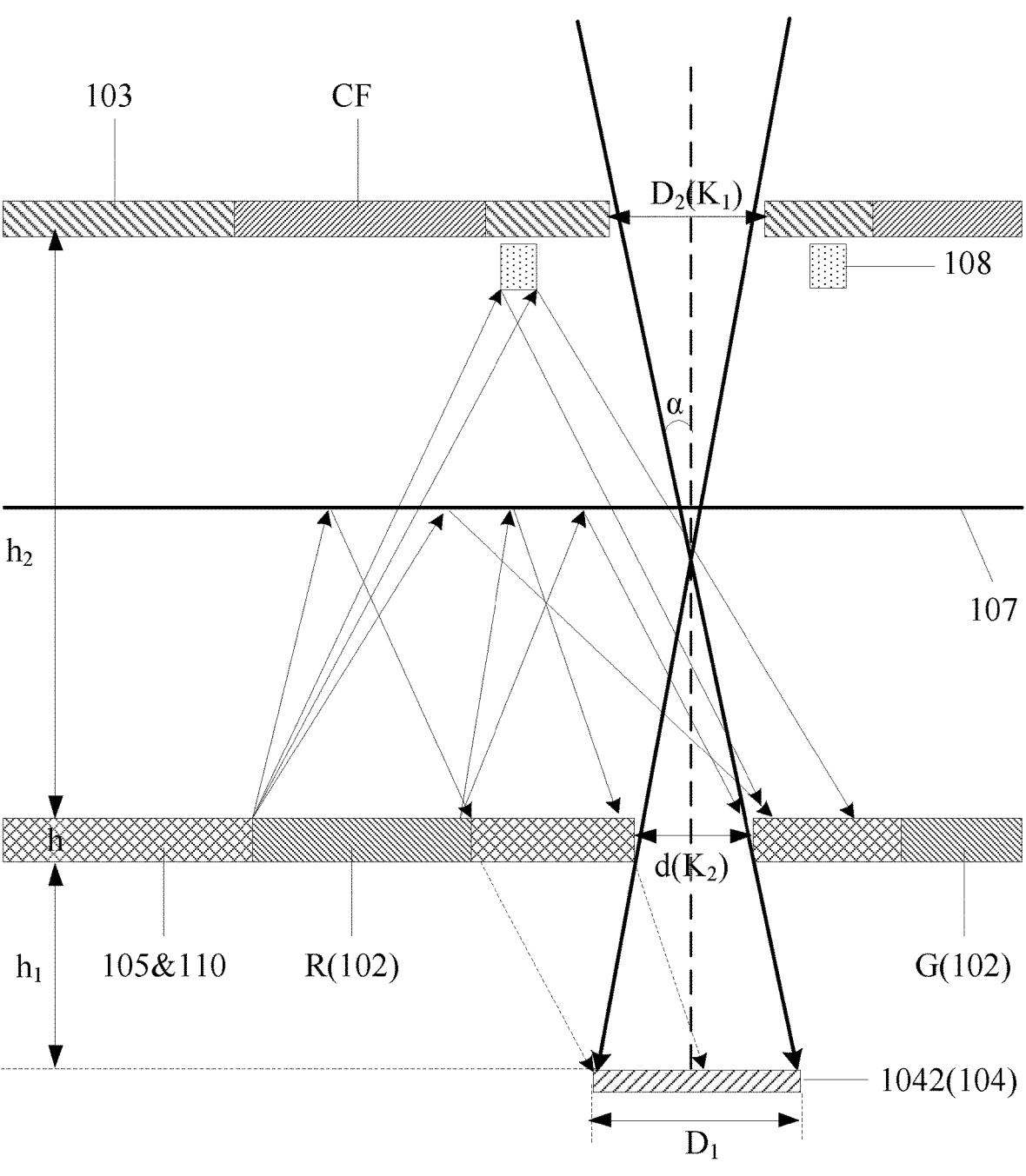
FIG. 6 is a schematic diagram of a micro-collimation optical path channel formed by a photoelectric conversion layer and a first opening without being affected by a second opening.

As shown in FIG. 6, the photosensitive device 104 and the first opening $K_1$ form a micro-collimation light path channel, and a light receiving angle α of fingerprint reflection is controlled to be:

$$\tan\alpha = (D_1 + D_2)/[2 * (h_1 + h_2 + h)]. \quad (4)$$

Figure 5:
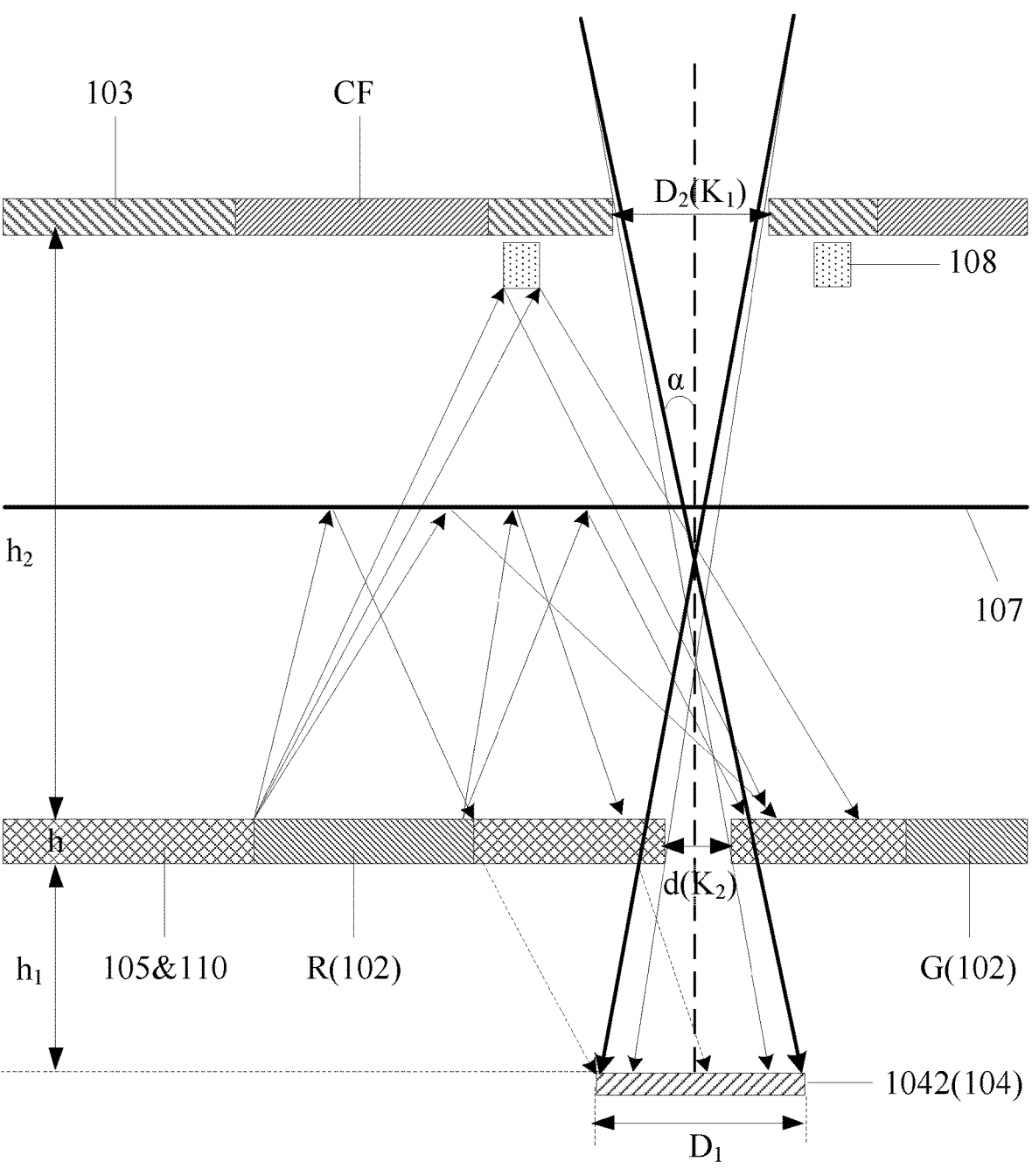
FIG. 5 is a schematic diagram of a micro-collimation light path channel formed by a second opening shielding part of a photoelectric conversion layer and a first opening.

As shown in FIG. 5, the second opening $K_2$ is used to block the reflected light from the film layer (e.g., the encapsulation layer 107, the touch control layer 108, etc.) between the light-emitting device 102 and the protective cover plate 106, to reduce the impact of the reflected light on the proportion of valleys and ridges luminous flux. In addition, the second opening $K_2$ cannot completely shield the micro-collimation light path channel formed by the photosensitive device 104 and the first opening $K_1$, and the second opening $K_2$ and the photosensitive device 104 need to satisfy a following relationship:

$$d = D_1 - 2h_1 * \tan\alpha. \quad (5)$$

After substituting the equation (5) into the equation (4), a relationship between the photosensitive device 104, the first opening $K_1$, and the second opening $K_2$ is as shown in equation (3).

Figure 2:
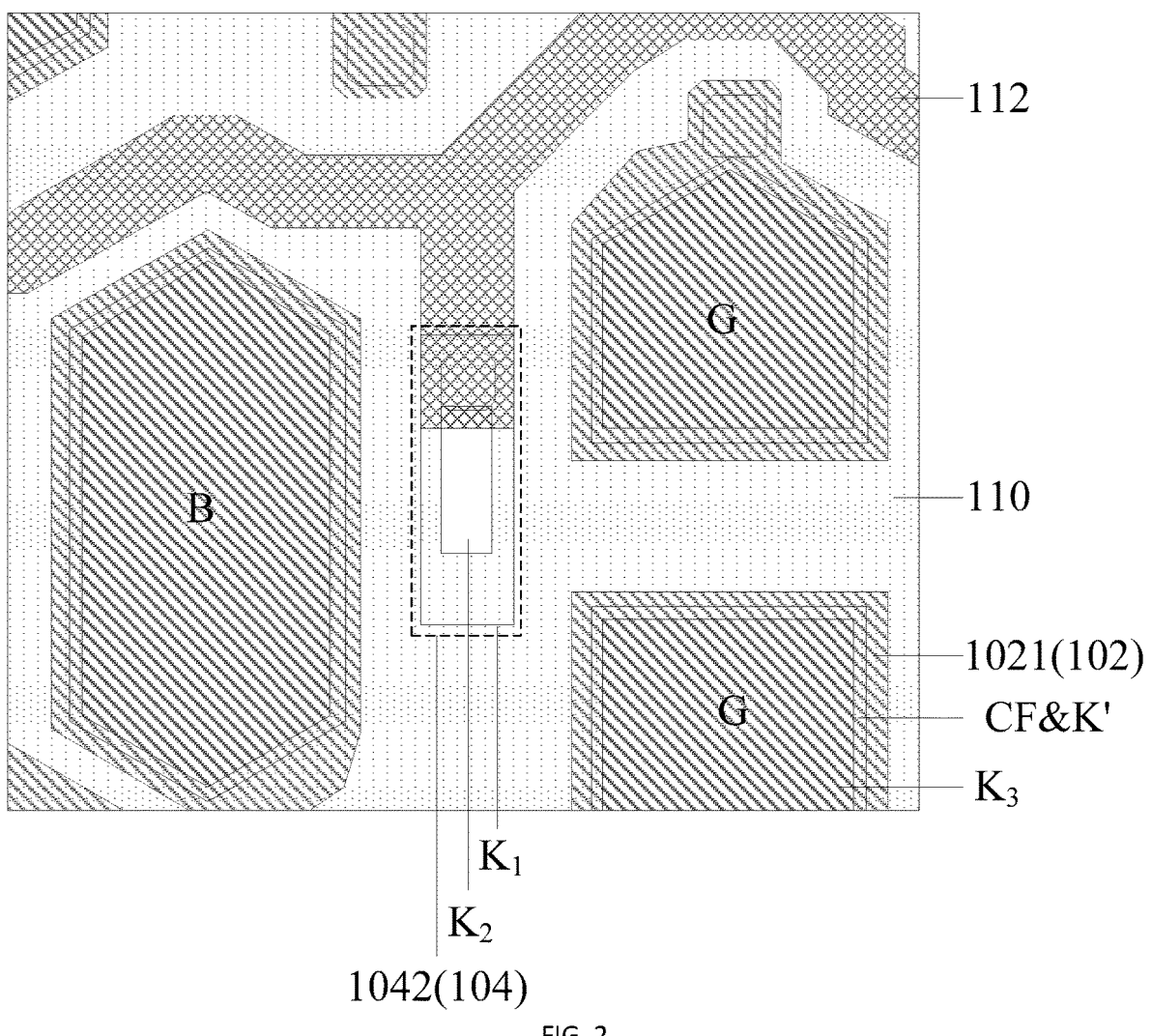
FIG. 2 is a partially enlarged schematic diagram of the $Z_1$ region in FIG. 1.
Figure 4:
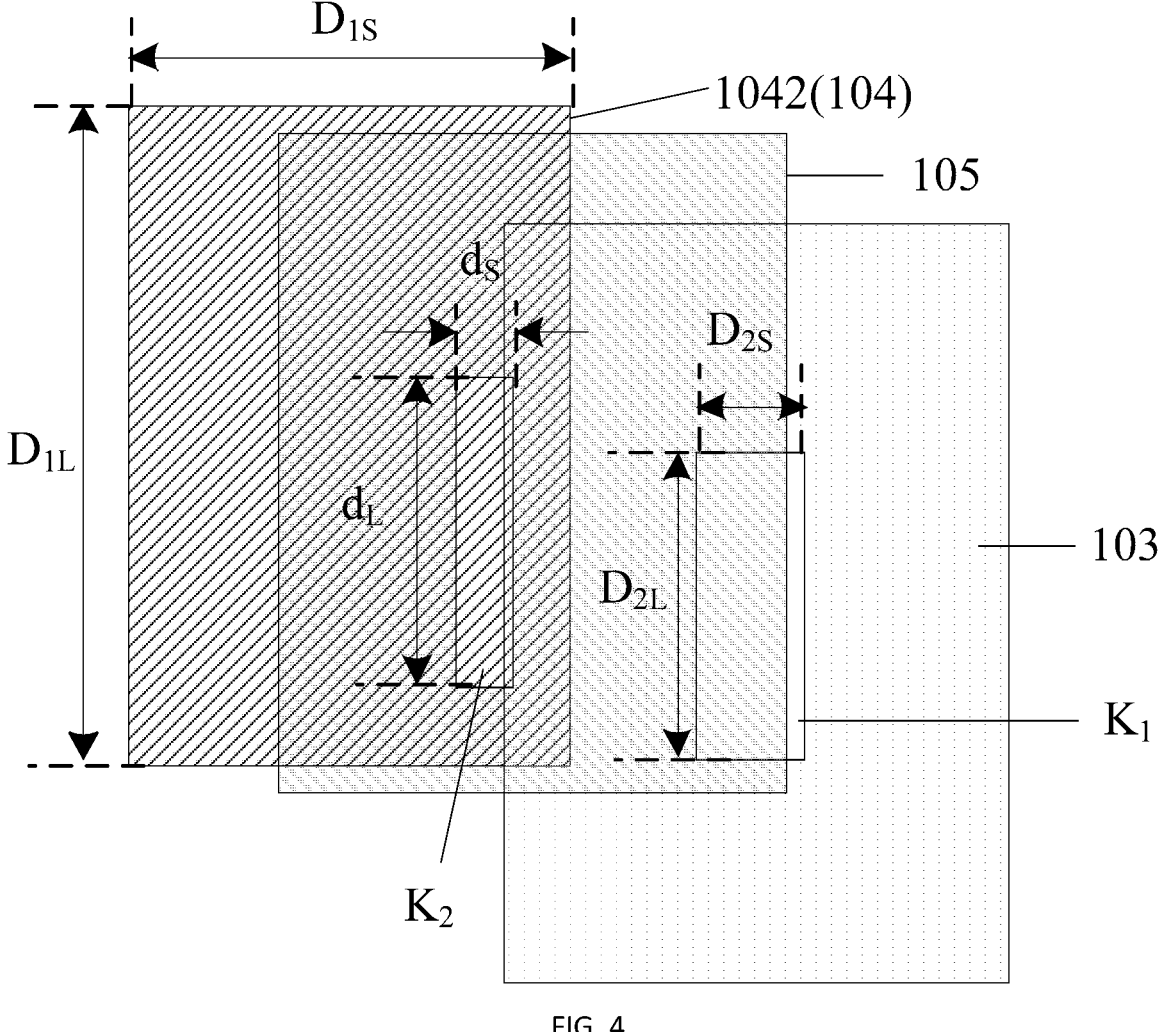
FIG. 4 is a diagram of a spatial position relationship between a photoelectric conversion layer, a first opening, and a second opening.

In some embodiments, as shown in FIGS. 2 and 4, in a case that the shapes of orthographic projections of the first opening $K_1$, the second opening $K_2$ and the photoelectric conversion layer 1042 included in the photosensitive device 104 are all rectangles, the length of the long side of the rectangle satisfy a following relationship:

$$d_L = D_{1L} - (D_{1L} + D_{2L}) * h_1/(h_1 + h_2 + h). \qquad (6)$$

The length of the short side of the rectangle satisfy a following relationship:

$$d_S = D_{1S} - (D_{1S} + D_{2S}) * h_1/(h_1 + h_2 + h). \qquad (7)$$

Where $d_L$ represents the length of the long side of the rectangle corresponding to the second opening $K_2$ (that is, the aperture of the second opening $K_2$ in a long side direction), $d_S$ represents the length of the short side of the rectangle corresponding to the second opening $K_2$ (that is, the aperture of the second opening $K_2$ in a short side direction), $D_{1L}$ represents the length of the long side of the rectangle corresponding to the photoelectric conversion layer 1042 included in the photosensitive device 104, $D_{1S}$ represents the length of the short side of the rectangle corresponding to the photoelectric conversion layer 1042 included in the photosensitive device 104), $D_{2L}$ represents the length of the long side of the rectangle corresponding to the first opening $K_1$ (that is, the aperture of the first opening $K_1$ in the long side direction), $D_{2S}$ represents the length of the short side of the rectangle corresponding to the first opening $K_1$ (that is, the aperture of the first opening $K_1$ in the short side direction).

In some embodiments, each of $D_{1L}$ and $D_{1S}$ is greater than or equal to 8 μm and less than or equal to 20 μm, each of $D_{2L}$ and $D_{2S}$ is greater than 5.6 μm and less than or equal to 20 μm, each of $d_L$ and $d_S$ is greater than 0 μm and less than or equal to 12 μm, $h_1$ is greater than or equal to 2 μm and less than or equal to 6 μm, $h_2$ is greater than or equal to 10 μm and less than or equal to 20 μm, and h is greater than or equal to 1 μm and less than or equal to 2 μm.

In order to find an optimal size of the second opening $K_2$ such that the proportion of stray light luminous flux is reduced and the proportion of valleys and ridges luminous flux is increased, a series of data is provided in an embodiment of the present disclosure, as shown in Table 1. Here, "PIN area" in Table 1 represents an area of the photoelectric conversion layer 1042 include in the photosensitive device 104, $d/D_1$ represents a ratio of an aperture of the second opening $K_2$ to a side length of the photoelectric conversion layer 1042. The proportion of valleys and ridges luminous flux represents a ratio of the valley/ridge luminous flux actually carrying the fingerprint characteristic signal to the total luminous flux received by the photosensitive device 104, and the proportion of reflection luminous flux represents a ratio of stray light luminous flux such as reflected light flux of a film layer (e.g., the encapsulation layer 107, the touch layer 108, the protective cover plate 106, etc.) between the light-emitting device 102 and the protective cover plate 106 to the total luminous flux received by the photosensitive device 104. 1 represents that the noise reduction layer 105 is not provided, each of 2 to 6 represents that the noise reduction layers 105 is provided, and apertures of the second openings $K_2$ included in the noise reduction layers 105 of 2 to 6 are gradually reduced.

As can be seen from Table 1, in a case that the intensity of the light source is 1 lm (lumen), and the area of the PIN (i.e., the photoelectric conversion layer 1042) is 192 μm²: when there is no noise reduction layer 105, the proportion of valleys and ridges luminous flux of the photosensitive device 104 is 0.87%, and the proportion of reflection luminous flux is as high as 47%; when $d:D_1$ is 1:1, the second opening $K_2$ does not affect the micro-collimation optical path channel formed by the photosensitive device 104 and the first opening $K_1$, and at this time, the proportion of reflection luminous flux is reduced to 31%, and the proportion of valleys and ridges luminous flux is increased to 1.24%; when $d:D_1$ is 0.8:1, the proportion of reflection luminous flux is further reduced to 24%, and the proportion of valleys and ridges luminous flux is further increased to 1.31%; when $d:D_1$ is 0.6:1, the proportion of reflection luminous flux is further reduced to 17%, and the proportion of valleys and ridges luminous flux is further increased to 1.81%; when $d:D_1$ is 0.5:1, the proportion of reflection luminous flux is further reduced to 12%, and the proportion of valleys and ridges luminous flux is 1.42%, without further increase; when $d:D_1$ is 0.4:1, the proportion of reflection luminous flux is further reduced to 9%, and the proportion of valleys and ridges luminous flux is 0.97%, without further increase. The present disclosure finds that the valley and ridge image of the fingerprint is the clearest when $d:D_1$ is 0.6:1, and when the second opening $K_2$ is further reduced (for example, the ratio of $d:D_1$ is reduced to 0.5:1 and 0.4:1), the proportion of reflection luminous flux can be further reduced, while the proportion of valleys and ridges luminous flux is not increased, because the noise reduction layer 105 shields the micro-collimation light path channel formed by the photosensitive device 104 and the first opening $K_1$. As a result, valley and ridge information reflected by the finger is blocked, and although the proportion of reflection luminous flux decreases, the proportion of useful valley and ridge information decreases faster. Finally, the proportion of valleys and ridges luminous flux of the fingerprint in the total luminous flux received by the photosensitive device 104 is reduced.

TABLE 1

| | 1 | 2 | 3 | 4 | 5 | 6 |
|---|---|---|---|---|---|---|
| Intensity of the light source | 1 lm | 1 lm | 1 lm | 1 lm | 1 lm | 1 lm |
| Area of the PIN | 192 μm² | 192 μm² | 192 μm² | 192 μm² | 192 μm² | 192 μm² |
| $d/D_1$ | — | 1:1 | 0.8:1 | 0.6:1 | 0.5:1 | 0.4:1 |
| Proportion of valleys and ridges luminous flux | 0.87% | 1.24% | 1.31% | 1.81% | 1.42% | 0.97% |

TABLE 1-continued

|  | 1 | 2 | 3 | 4 | 5 | 6 |
|---|---|---|---|---|---|---|
| Proportion of reflection luminous flux | 47% | 31% | 24% | 17% | 12% | 9% |

Figure 7:
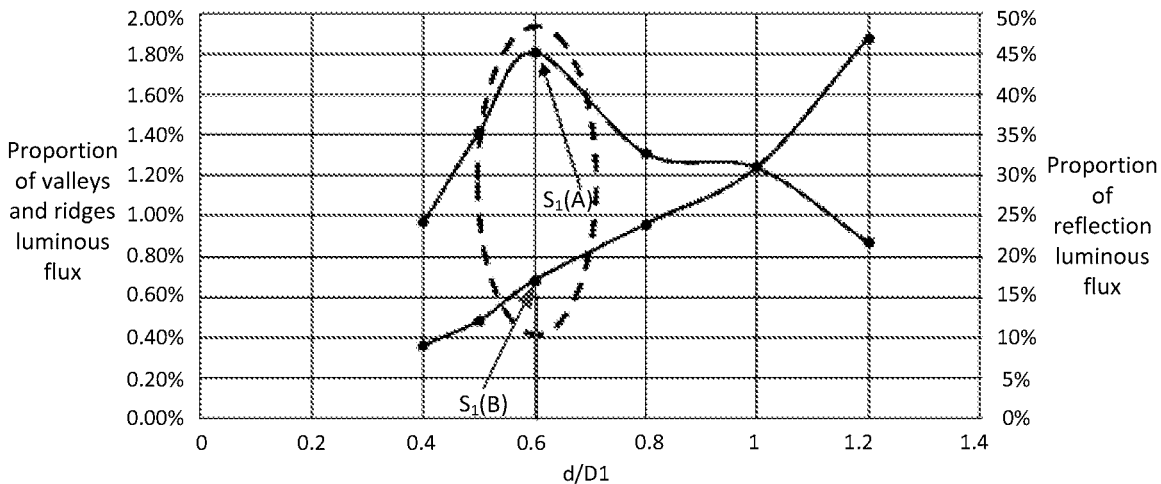
FIG. 7 is a curve diagram of proportions of valleys and ridges and proportions of reflection under different second openings.

FIG. 7 is a curve diagram of a relationship between $d/D_1$ and the proportion of valleys and ridges luminous flux and the proportion of reflection luminous flux in Table 1. $S_1(A)$ represents a curve of $d/D_1$ and the proportion of valleys and ridges luminous flux, and $S_1(B)$ represents a curve of $d/D_1$ and the proportion of reflection luminous flux. It can be seen from Table 1 and FIG. 7 that by setting the noise reduction layer 105 with the second openings $K_2$, when $d/D_1=0.6$, the proportion of valleys and ridges luminous flux is the highest. At this time, the proportion of reflection luminous flux is reduced from 47% without the noise reduction layer 105 to 17%, which is reduced by about twice, and the proportion of valleys and ridges luminous flux is increased from 0.87% to 1.81%, indicating that the present disclosure plays a role in reducing the light emitted by the light-emitting device 102 to be reflected to the photosensitive device 104 by each film layer inside the display substrate before reaching the finger, so that the proportion of valleys and ridges luminous flux is increased indirectly, improving the accuracy of in-display fingerprint acquisition.

Figure 8:
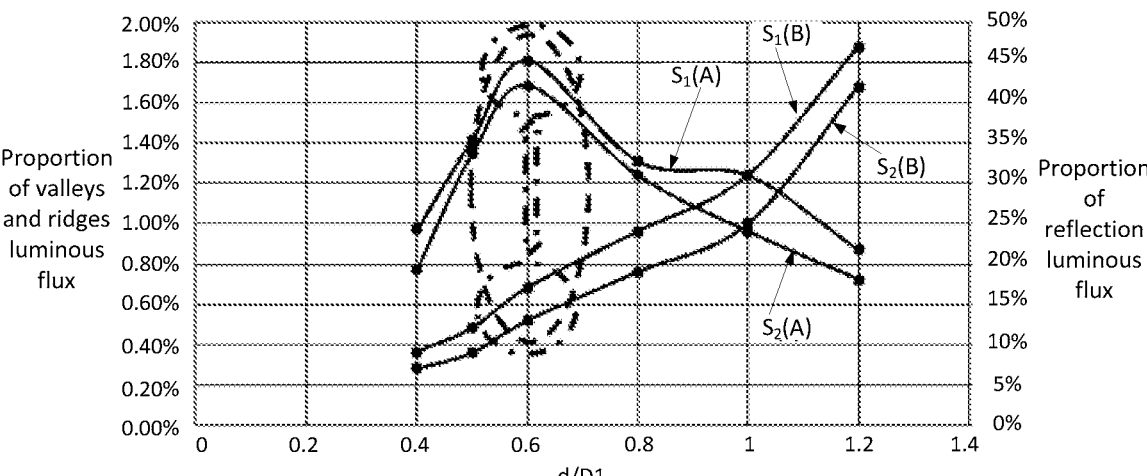
FIG. 8 is another curve diagram of proportions of valleys and ridges and proportions of reflection under different second openings.

In addition, the present disclosure tests another size of photosensitive device 104, that is, the test is performed by only changing the area size of the photoelectric conversion layer 1042 included in the photosensitive device 104 in Table 1, when other parameters held constant, and the results are shown in FIG. 8. In FIG. 8, $S_1(A)$ represents a curve of $d/D_1$ and the proportion of valleys and ridges luminous flux for the area of the photosensitive device 104 shown in Table 1 and FIG. 7; $S_1(B)$ represents a curve of $d/D_1$ and the proportion of reflection luminous flux for the area of the photosensitive device 104 shown in Table 1 and FIG. 7; $S_2(A)$ represents a curve of $d/D_1$ and the proportion of valleys and ridges luminous flux for another area of the photosensitive device 104; $S_2(B)$ represents a curve of $d/D_1$ and the proportion of reflection luminous flux for another area of the photosensitive device 104. It can be seen from FIG. 8 that when $d/D_1$ is equal to 0.6, the proportion of valleys and ridges luminous flux is the highest, which is the same as the rule in Table 1 and FIG. 7, further illustrating the feasibility of the scheme according to the present disclosure.

In some embodiments, in the above display substrate provided by embodiments of the present disclosure, the photosensitive device 104, the first opening $K_1$ and the second opening $K_2$ may be arranged in a one-to-one correspondence, and an orthographic projection of a center of the photosensitive device 104 on the base substrate 101, an orthographic projection of a center of the first opening $K_1$ on the base substrate 101, and an orthographic projection of a center of the second opening $K_2$ on the base substrate 101 substantially coincide with each other (i.e., exactly coincide or within the error range caused by factors such as process or measurement, etc.), so as to facilitate formation of a collimated light path and improve the proportion of valleys and ridges luminous flux.

In some embodiments, in the above display substrate provided by embodiments of the present disclosure, as shown in FIG. 1, the orthographic projections of the plurality of photosensitive devices 104 on the base substrate 101 may be located within orthographic projections of at least part of column gaps between the light-emitting devices 102 on the base substrate 101. In some embodiments, as shown in FIG. 1, the plurality of light-emitting devices 102 may include a plurality of first light-emitting devices B, a plurality of second light-emitting devices G, and a plurality of third light-emitting devices R. A light emitting color of the first light-emitting device B, a light emitting color of the second light-emitting device G, and a light emitting color of the third light-emitting device R are different. For example, the light emitting color of the first light-emitting device B is blue, the light emitting color of the second light-emitting device G is green, and the light emitting color of the third light-emitting device R is red. The first light-emitting device B, the second light-emitting device G, and the third light-emitting device R are circularly arranged in a row direction, two adjacent light-emitting devices 102 of a same color in a same row are spaced by (n−1) light-emitting devices 102, and N is a total number of light emitting colors. The orthographic projections of the plurality of photosensitive devices 104 on the base substrate 101 may be located within orthographic projections of all column gaps at both sides of each second light-emitting device G on the base substrate 1, so that center connecting lines between two adjacent photosensitive devices 104 in one row and two adjacent photosensitive devices 104 in a row adjacent to the one row forms a trapezoid M or an inverted trapezoid N, so as to be beneficial to realizing large-area fingerprint identification.

Figure 9:
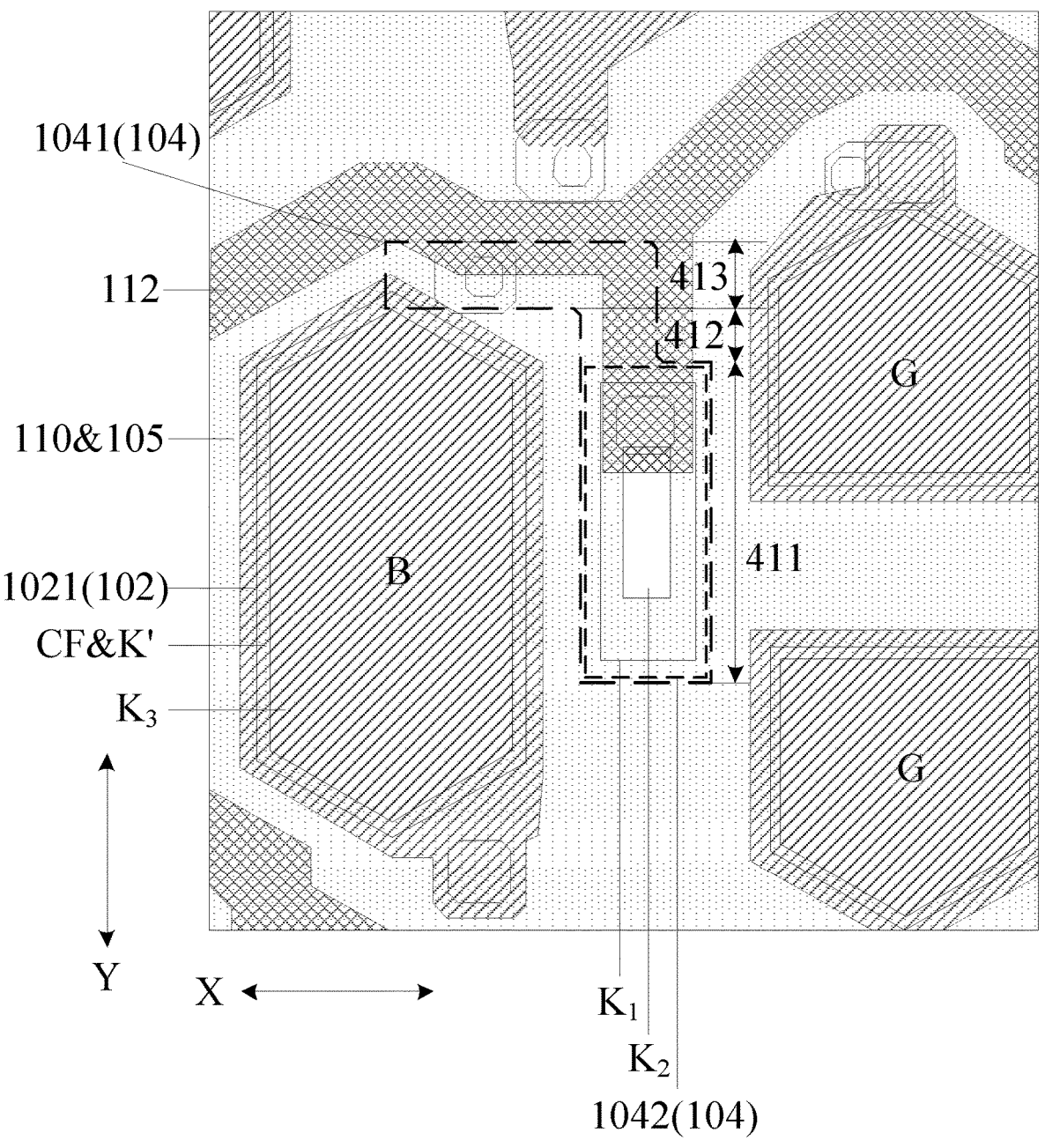
FIG. 9 is a partially enlarged schematic view of the $Z_2$ region in FIG. 1.
Figure 11:
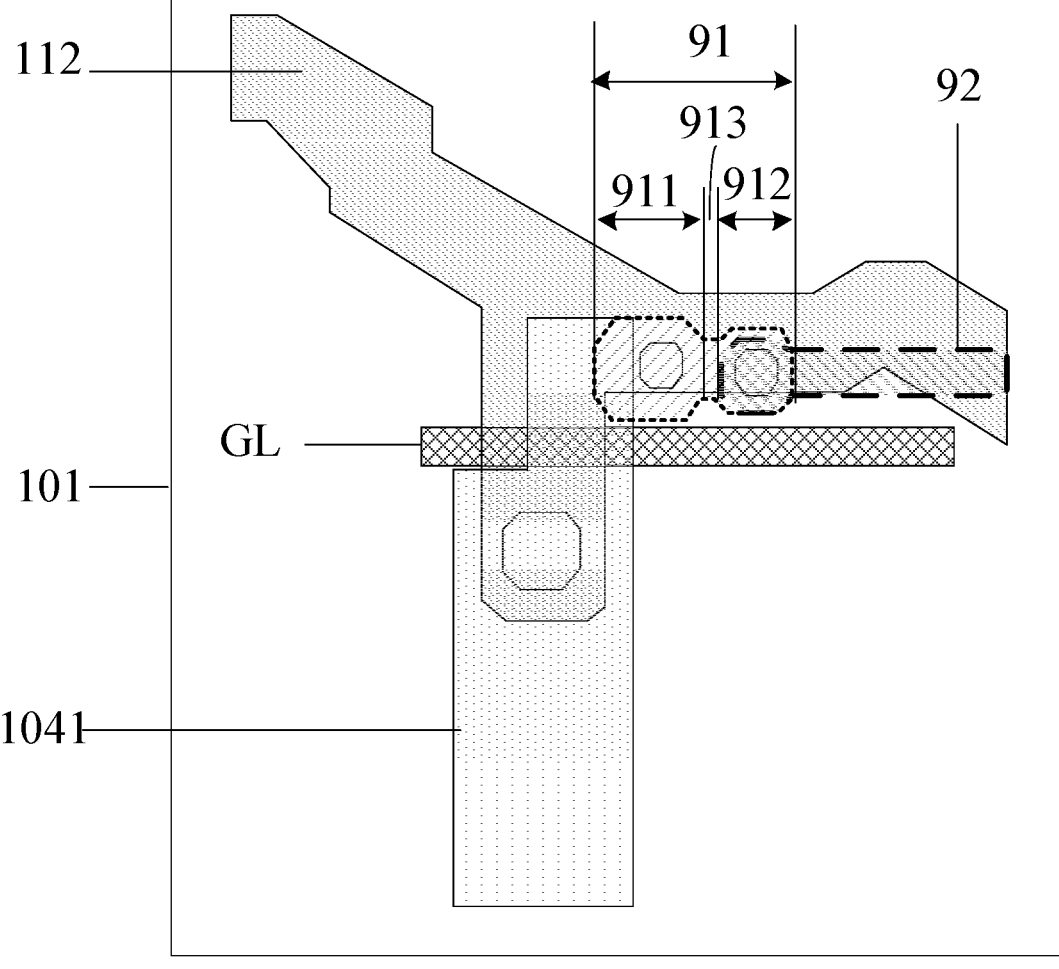
FIG. 11 is a partially enlarged schematic view of the $Z_3$ region in FIG. 10.

In some embodiments, in the above display substrate provided by embodiments of the present disclosure, as shown in FIGS. 9 and 11, a bottom electrode 1041 of the photosensitive device 104 includes a first subsection 411 and a second subsection 412 which are integrally arranged. The first subsection 411 and the second subsection 412 respectively extend along the column direction Y; a width of the first subsection 411 in the row direction X is greater than a width of the second subsection 412 in the row direction X, and a side of the first subsection 411 away from the second light-emitting device G and a side of the second subsection 412 away from the second light-emitting device G are located on a same straight line. In some embodiments, the first subsection 411 is used for carrying the photoelectric conversion layer 1042, and the second subsection 412 is used for realizing electrical connection with a transistor 109. Moreover, the width of the second sub-section 412 is set to be narrow, which can effectively reduce the coupling capacitance between the whole bottom electrode 1041 and other conductive layers.

Figure 10:
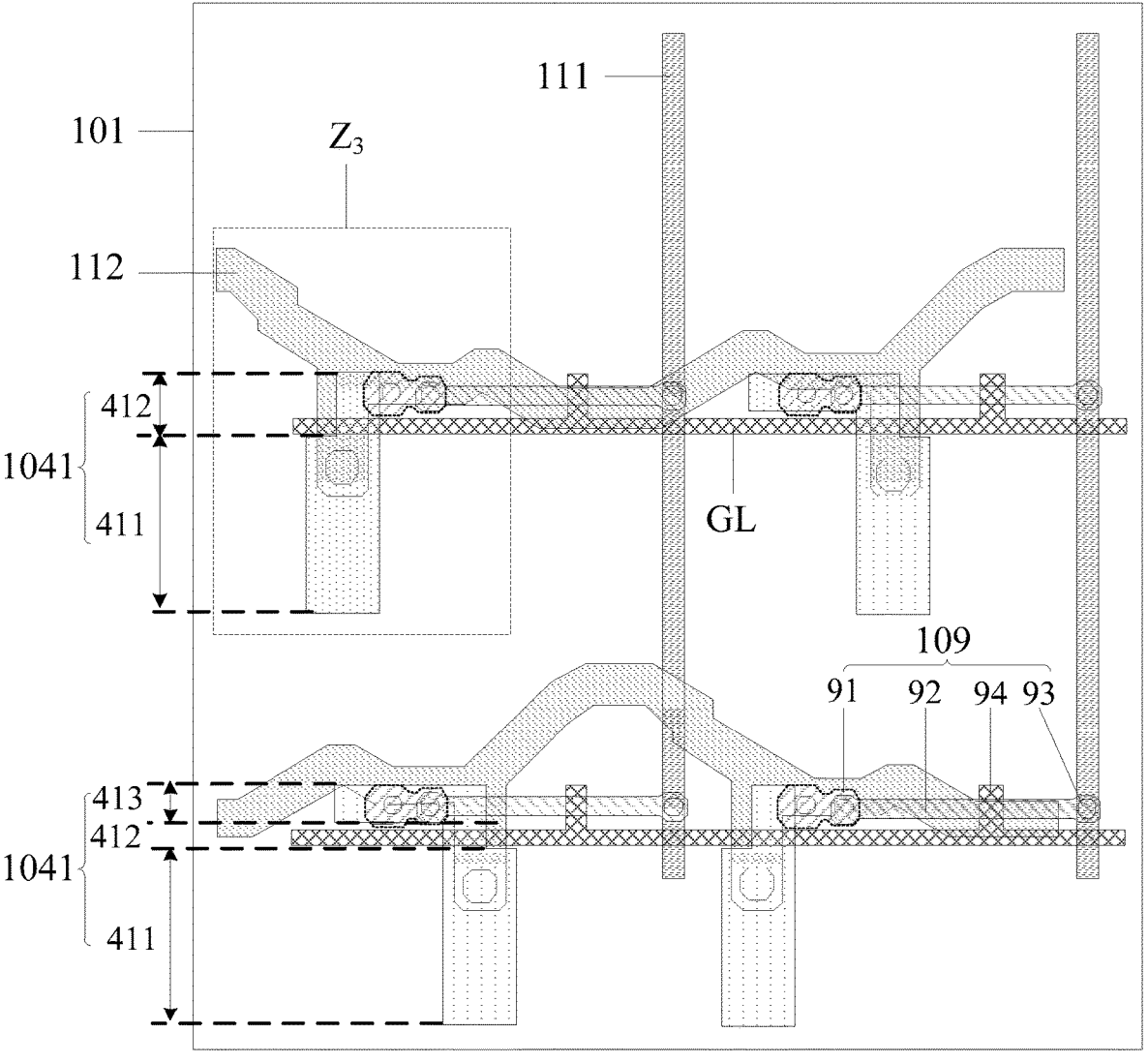
FIG. 10 is a structural schematic diagram of a photosensitive device and a transistor connected with the photosensitive device.

In some embodiments, in the above display substrate provided by embodiments of the present disclosure, as shown in FIGS. 1, 9 and 10, the bottom electrode 1041 of the photosensitive device 104 may further include a third subsection 413 at a column gap between the second light-emitting device G and the first light-emitting device B. The third subsection 413 is integrally arranged with the second subsection 412 at an end away from the first sub-section 411, and the third subsection 413 extends in the row direction X. In some embodiments, the third subsection 413 is electrically connected with a transistor 109 at a column gap between the second light-emitting device G and the first light-emitting device B, and the second subsection 412 is electrically connected with the transistor 109 through the third subsection 413. The second subsection 412 is directly electrically connected with the transistor 109 at a column gap between the second light-emitting device G and the third light-emitting device R, that is, there is no third subsection 413 between the second subsection 412 and the transistor 109.

Figure 3:
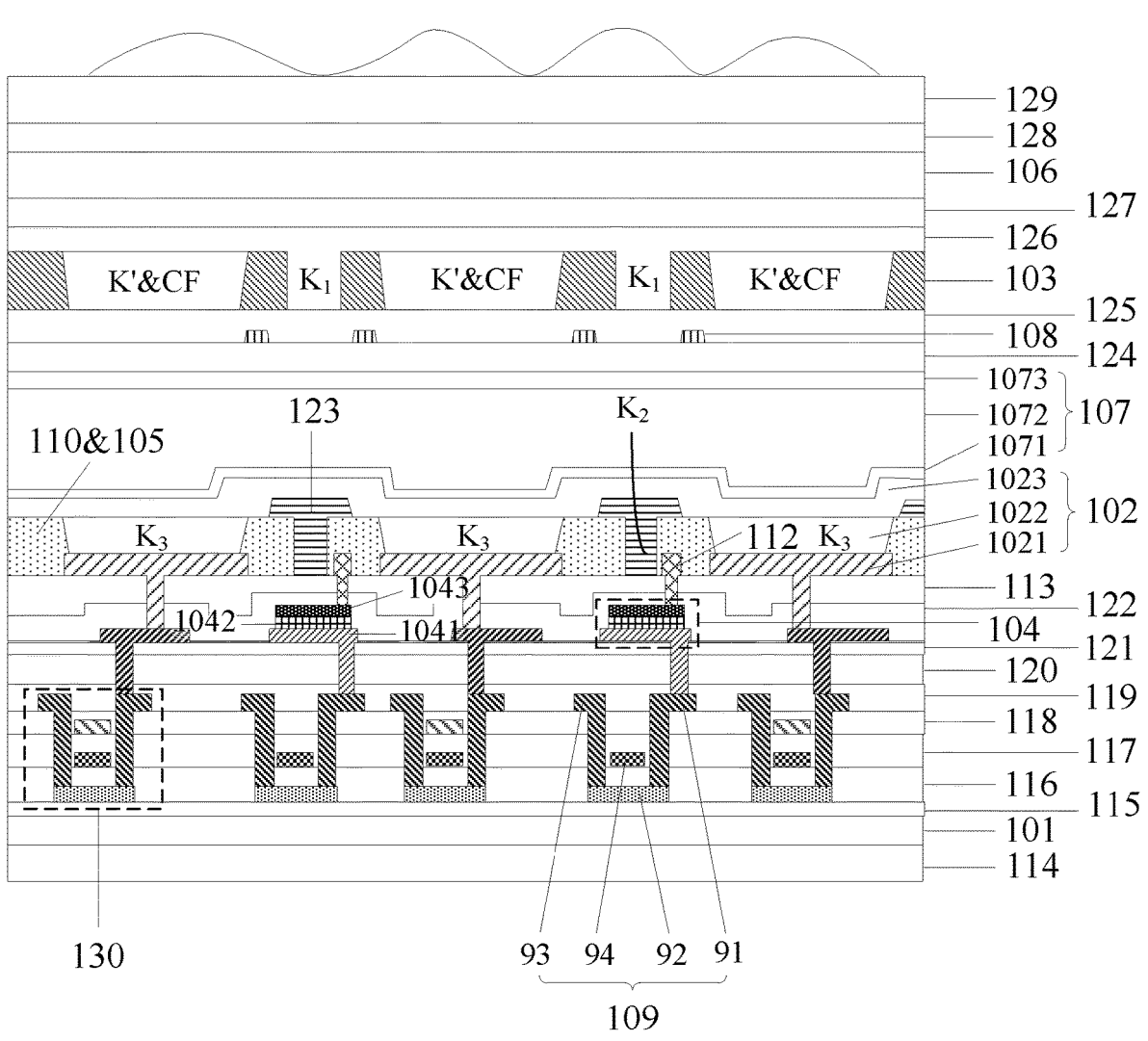
FIG. 3 is a cross-sectional view along the line I-II in FIG. 1.

In some embodiments, in the above display substrate provided by embodiments of the present disclosure, as shown in FIGS. 3, 10 and 11, the display substrate further includes a plurality of transistors 109, the plurality of transistors 109 are arranged between the layer where the plurality of photosensitive devices 104 are located and the base substrate 101. A first electrode 91 of each of the transistors 109 is connected with the third subsection 413 at the column gap between the second light-emitting device G and the first light-emitting device B, and the second subsections 412 at the column gap between the second light-emitting device G and the third light-emitting devices R in one-to-one correspondence, to drive the photosensitive device 104 through the transistor 109, where the transistor 109 is included in a driving circuit for a Passive Pixel Sensor (PPS) mode.

In some embodiments, in the above display substrate provided by embodiments of the present disclosure, as shown in FIGS. 10 and 11, a shape of an orthographic projection of the first electrode 91 of the transistor 109 on the base substrate 101 includes a first octagon 911, a second octagon 912, a rectangle 913 connected with the first octagon 911 and the second octagon 912. The first octagon 911 is electrically connected with the bottom electrode 1041 of the photosensitive device 104, and the second octagon 912 is electrically connected with an active layer 92. In some embodiments, the area of the first octagon 911 may be greater than the area of the second octagon 912, so that the first electrode 91 has a gourd-like shape. Of course, in some embodiments, the orthographic projection of the first electrode 91 of the transistor 109 on the base substrate 101 can also be other shapes, which is not limited herein. In some embodiments, the first electrode 91 of the transistor 109 may be a source electrode or a drain electrode, which is not limited herein.

In some embodiments, in the above display substrate provided by embodiments of the present disclosure, as shown in FIGS. 10 and 11, a plurality of transistors 109 are arranged in an array on the base substrate 101, active layers 92 of the transistors 109 in a same row are located on a same straight line, and active layers 92 of the transistors 109 in a same column are arranged in parallel, to simplify the layout design of the transistors 109. In addition, as shown in FIG. 10, a second electrode 93 of the transistor 109 is electrically connected with a reading line 111, a gate electrode 94 of the transistor 109 is electrically connected with a gate line GL, to control on and off of the transistor 109 through the gate line GL, and an electric signal for fingerprint recognition output by the transistor 109 is read through the reading line 111.

In some embodiments, in the above display substrate provided by embodiments of the present disclosure, as shown in FIGS. 1 and 3, the display substrate may further include a plurality of bias lines 112, and the plurality of bias lines 112 and anodes 1021 of the light-emitting devices 102 are arranged in a same layer, so as to save cost and reduce the number of film layers. There are gaps between the bias lines 112 and the anodes 1021 of the light-emitting devices 102, so that signals on the bias lines 112 and the anodes 1021 can be prevented from interfering with each other.

In some embodiments, in the above display substrate provided by embodiments of the present disclosure, as shown in FIGS. 1 and 3, orthographic projections of the plurality of bias lines 112 on the base substrate 101 are located at row gaps between the light-emitting devices 102, and one of the bias lines 112 is electrically connected with a top electrode 1043 of the photosensitive device 104 in a same row, so as to load the photosensitive device 104 at the column gap with a bias signal via the bias line 112.

In some embodiments, in the above display substrate provided by embodiments of the present disclosure, as shown in FIGS. 1 and 10, in order to effectively avoid the anode 1021 of the light-emitting device 102, the bias line 112 may be a line with a wavy shape. It should be understood that in a case that the anode 1021 of the light-emitting device 102 occupies a small space and row gaps between the anodes 1021 are large, there may be a space large enough to arrange the bias line 112, and in this case, the bias line 112 may be arranged as a straight line so as to facilitate the fabrication of the bias lines 112.

Figure 12:
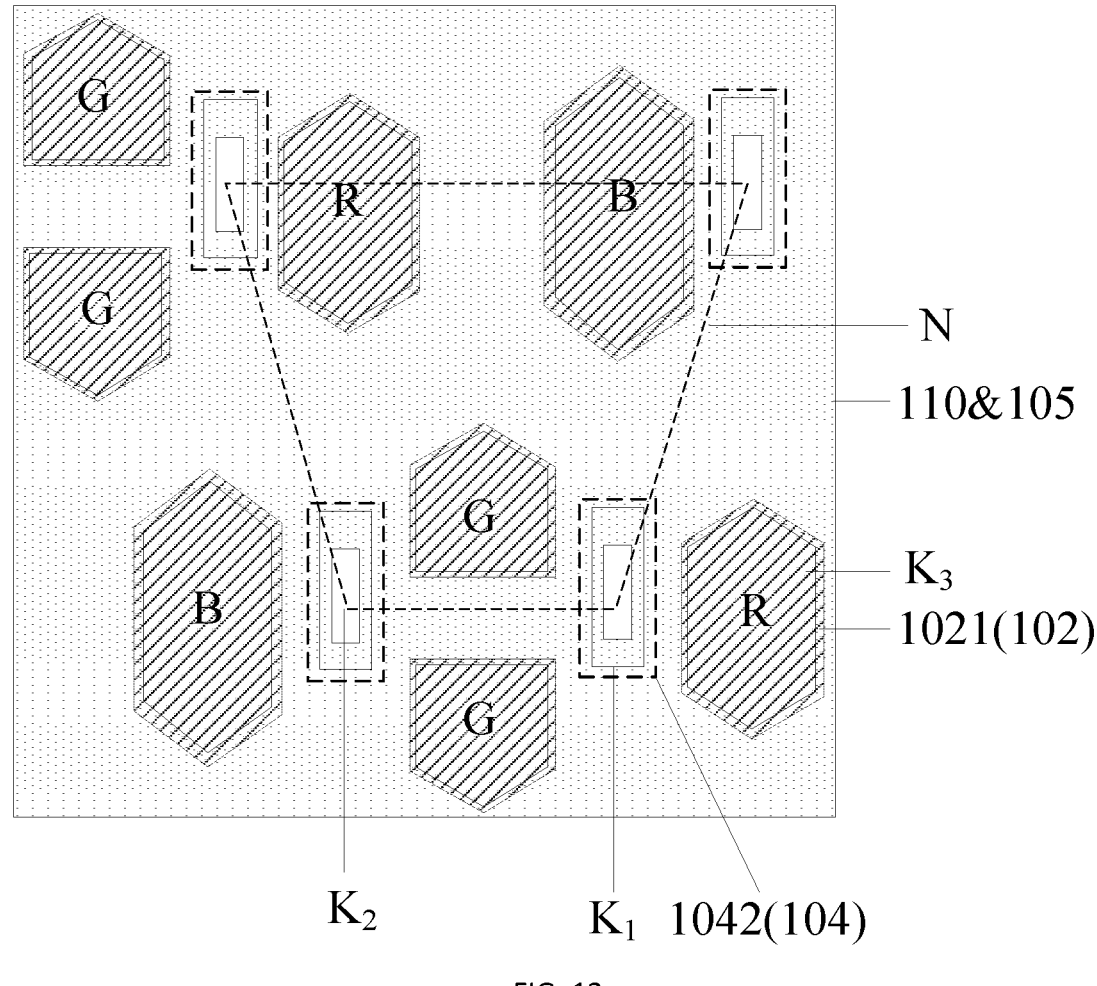
FIG. 12 is a schematic diagram of a structure in which a pixel defining layer is multiplexed as a noise reduction layer.

In some embodiments, in the above display substrate provided by embodiments of the present disclosure, as shown in FIGS. 1, 3 and 12, a pixel defining layer 110 is arranged between a layer where the anode 1021 of the light-emitting device 102 is located and a light emitting functional layer 1022 of the light-emitting device 102. In order to reduce the number of film layers and realize a light and thin design, the pixel defining layer 110 may be multiplexed as the noise reduction layer 105. The pixel defining layer 110 may be made of a material having a relatively high absorbance (e.g., black resin) or a material having a very low reflectance (e.g., alumina). In general, the pixel defining layer 110 has a pixel opening $K_3$ at which the light-emitting device 102 is disposed, and the region defined by the pixel opening $K_3$ is the effective light emitting region of the light-emitting device 102.

Figure 13:
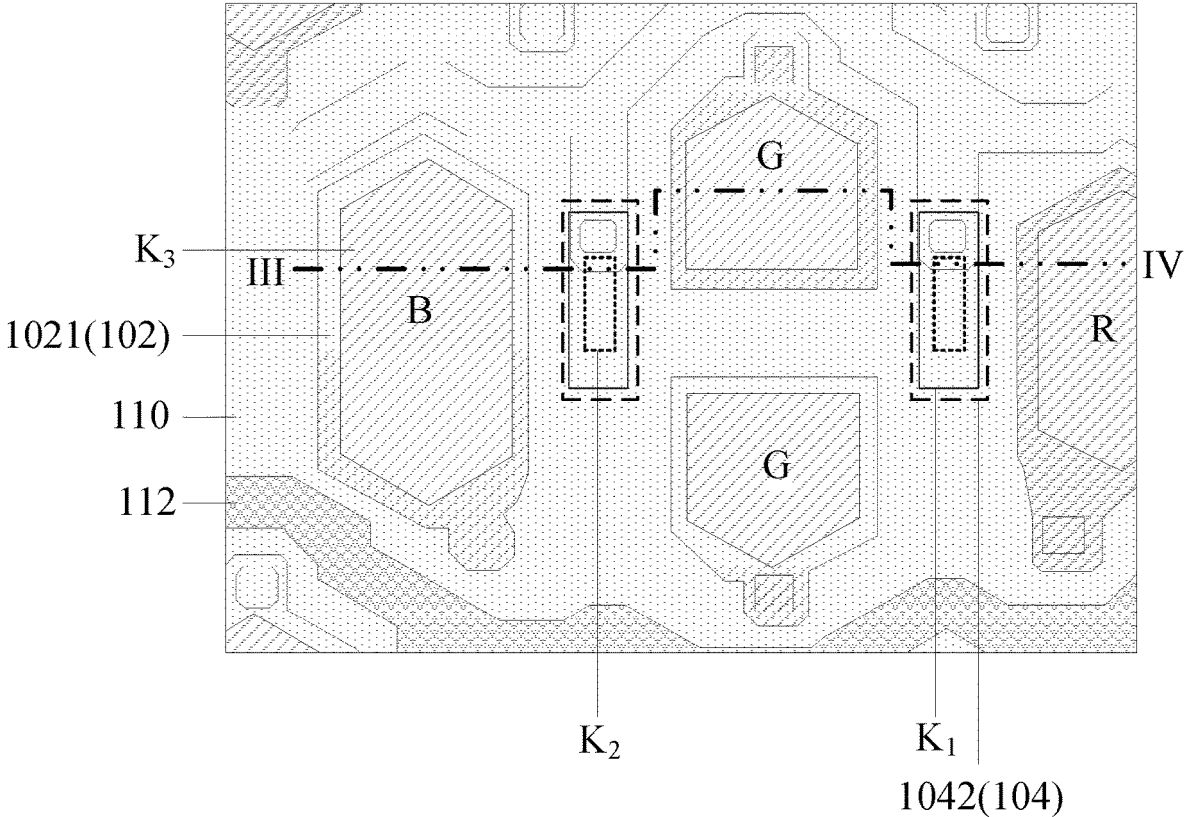
FIG. 13 is a schematic diagram of a structure in which a first planarization layer is multiplexed as a noise reduction layer.
Figure 14:
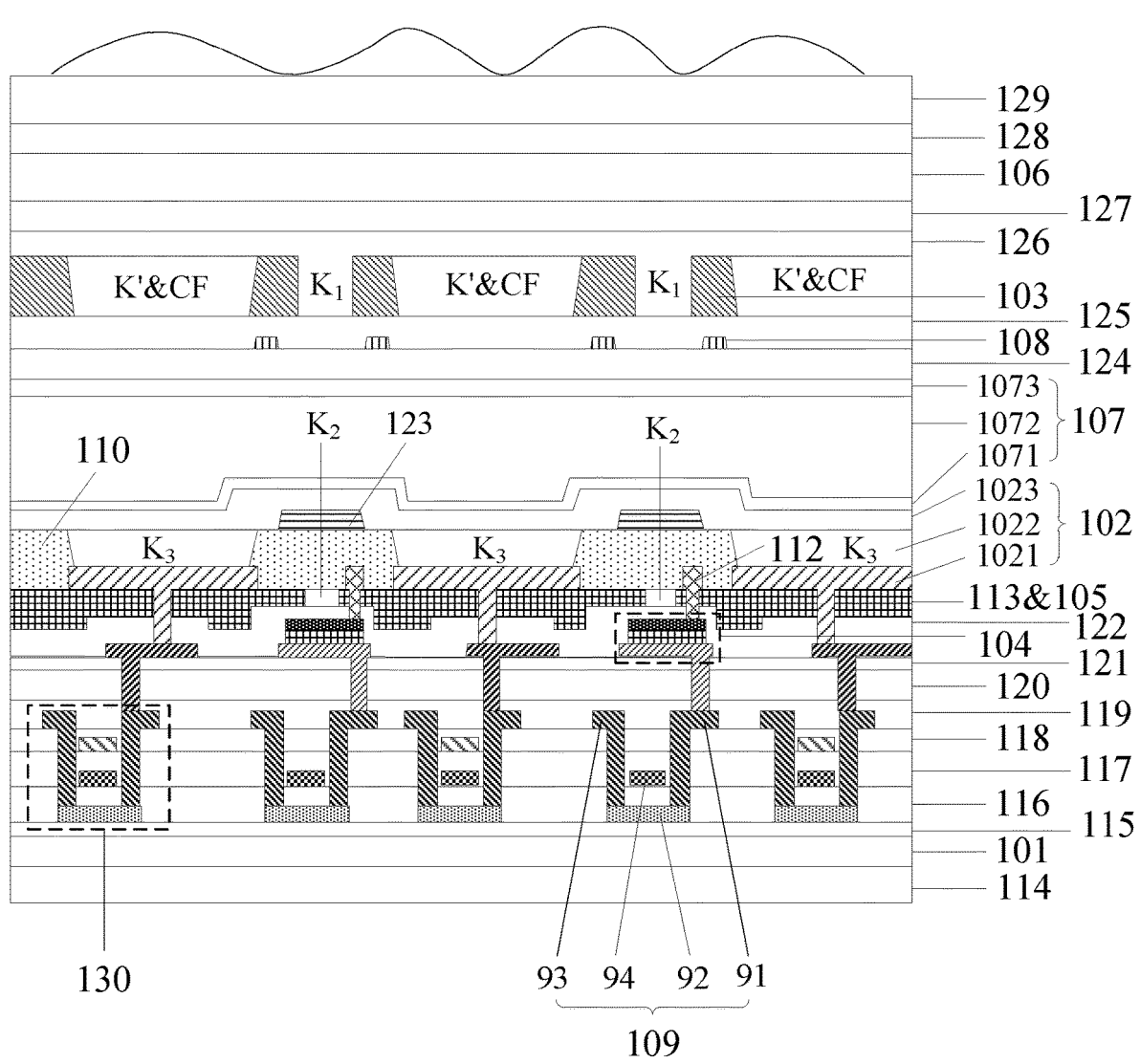
FIG. 14 is a cross-sectional view along the line III-IV in FIG. 13.

In some embodiments, in the above display substrate provided by embodiments of the present disclosure, as shown in FIGS. 13 and 14, the display substrate may further include a first planarization layer 113, and the first planarization layer 113 is arranged between the layer where the light-emitting device 102 and the layer where the photosensitive device 104 is located. In order to reduce the number of film layers and realize a light and thin design, the planarization layer may be multiplexed as the noise reduction layer 105. The first planarization layer 113 may be made of a material having a relatively high absorbance (e.g., black resin) or a material having a very low reflectance (e.g., alumina).

Figure 15:
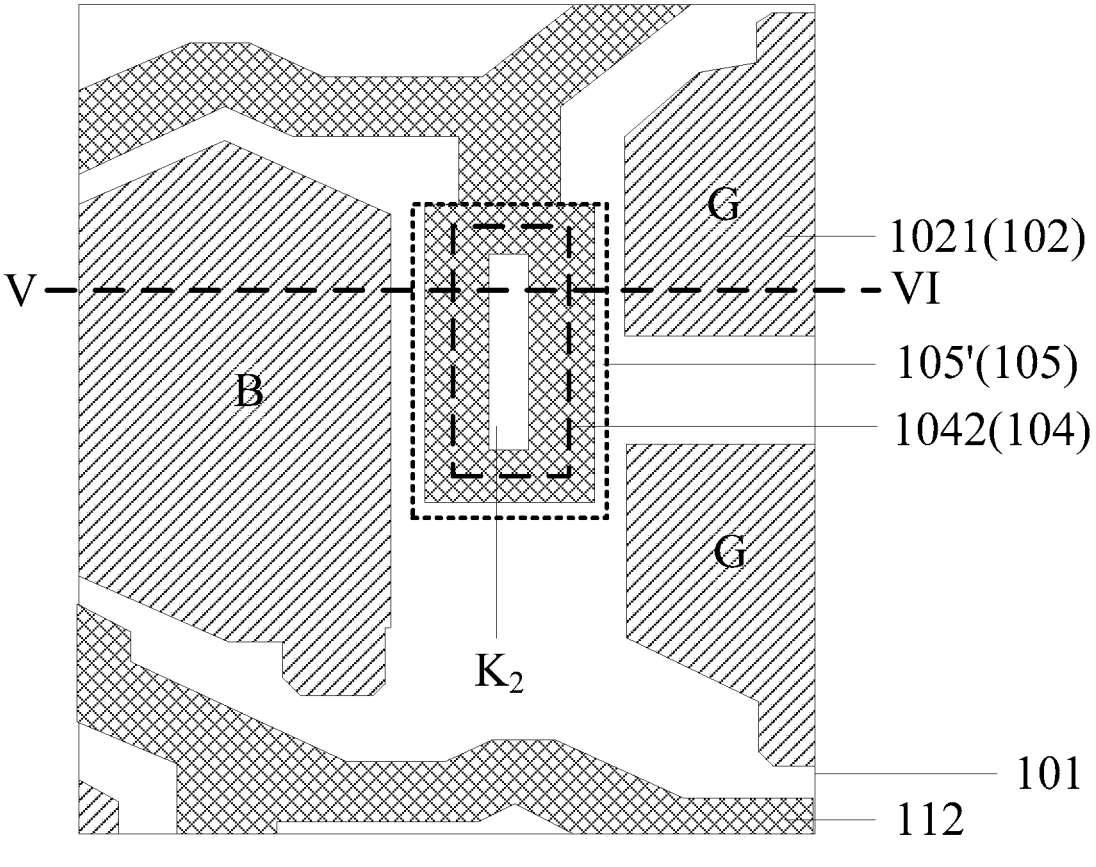
FIG. 15 is a schematic diagram of a structure in which a layer where anodes of the plurality of light-emitting devices are located is multiplexed as a noise reduction layer.
Figure 16:
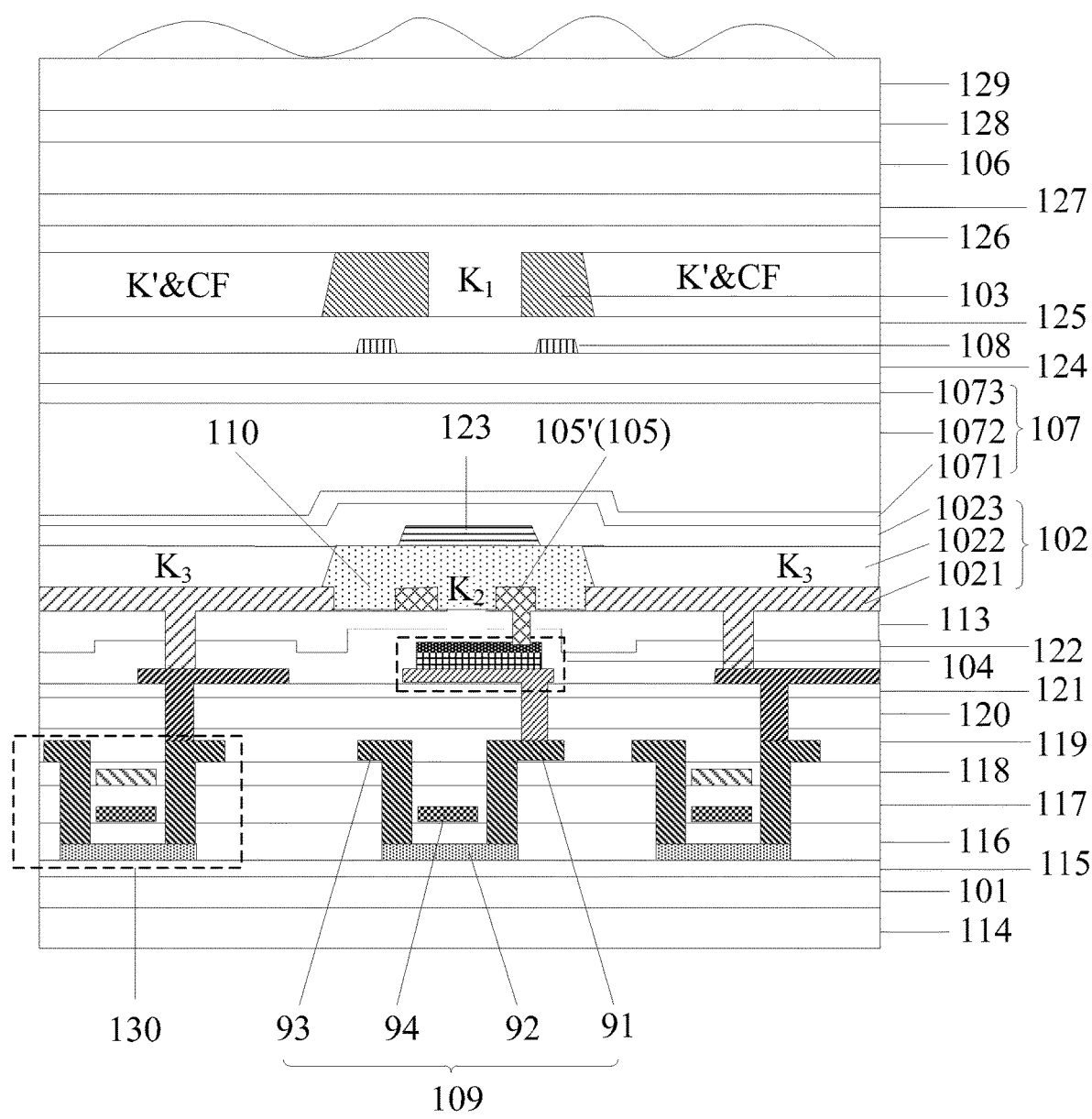
FIG. 16 is a cross-sectional view along the line V-VI in FIG. 15.

In some embodiments, in the above display substrate provided by embodiments of the present disclosure, as shown in FIGS. 15 and 16, the noise reduction layer 105 and the anode 1021 of the light-emitting device 102 may be arranged in a same layer to realize a light and thin design. In this case, the noise reduction lay 105 may include a plurality of noise reduction portions 105', each of the noise reduction portions 105' is arranged correspondingly to one of the photosensitive devices 104, and each of the noise reduction portions 105' includes a second opening $K_2$. An orthographic projection of the noise reduction portion 105' on the base substrate 101 is larger than an orthographic projection of the corresponding photosensitive device 104 on the base substrate 101, and there is a gap between the noise reduction portion 105' and the anode 1021 of the light-emitting device 102. In some embodiments, in a case that the noise reduction portion 105' and the bias line 112 are arranged in a same layer as the anode 1021, the noise reduction portion 105' and the bias line 112 may be an integral structure as shown in FIG. 15.

In some embodiments, in the above display substrate provided by embodiments of the present disclosure, as shown in FIGS. 3, 14 and 16, the display substrate may further include a back film 114, a first buffer layer 115, a first gate insulating layer 116, a second gate insulating layer 117, an interlayer dielectric layer 118, a first insulation layer 119, a second planarization layer 120, a second insulation layer 121, a protection layer 122, a support layer 123, a second buffer layer 124, a third planarization layer 125, a fourth planarization layer 126, a first adhesive layer 127, a second adhesive layer 128, a base material layer 129, and a driving transistor 130.

In some embodiments, when a finger touches the base material layer 129 of the display substrate, the light-emitting device 102 is controlled to illuminate a surface light source to emit light, emitted light passes upward through the encapsulation layer 107, the color resistance CF, the protective cover plate 106 and other film layers to reach the fingerprint interface, i.e. the contact interface of the finger with the base material layer 129, and the light reflected and scattered back on the interface reaches the photosensitive device 104 through the protective cover plate 106, the color resistance CF, the encapsulation layer 107 and other film layers, and then the reflected light is received by the photosensitive device 104 and converted into an electrical signal. Since signals reflected by the valley and ridge are different, fingerprint recognition is performed to generate fingerprint images.

In some embodiments, the protective cover plate 106 may be an ultra-thin glass (UTG) cover plate. Due to the ultra-thin glass cover plate maintaining the characteristics of glass while also possessing good flexibility, it can fully meet the needs of folding products. The ultra-thin glass (UTG) refers to a glass layer having a thickness on the order of tens of microns or less, which can be bent and deformed and foldable. Compared with the polymer plastic film, the ultra-thin glass can effectively avoid screen damage and provide better optical clarity. At the same time, the ultra-thin glass is not easy to crease and has good reliability. Moreover, the ultra-thin glass will not be decomposed naturally like plastic, and has a long life, thus providing more stable and reliable protection for the display screen. The encapsulation layer 107 may include a first inorganic encapsulation layer 1071, an organic encapsulation layer 1072, and a second inorganic encapsulation layer 1073 which are stacked. The transistor 109 and the driving transistor 130 may be a top gate transistor, a bottom gate transistor, or a double gate transistor, which is not limited herein. Furthermore, the active layer material of the transistor 109 and the driving transistor 130 can be low temperature polysilicon, amorphous silicon, oxide, etc., which is not limited herein.

On the basis of the same inventive concept, the present disclosure further provides a display apparatus, including the display substrate according to embodiments of the present disclosure. The display substrate may be an OLED display substrate. Since the principle of solving the problem of the display apparatus is similar to that of solving the problem of the display substrate, for implementations of the display apparatus, reference may be made to the above embodiments of the display substrate, and the repetition thereof is omitted. It will be understood by those skilled in the art that other essential components of the display substrate are included, and it is not intended to be exhaustive or to be limiting of the present disclosure.

In some embodiments, the above display apparatus provided by embodiments of the present disclosure may be: a mobile phone, a tablet computer, a television, a monitor, a laptop computer, a digital photo frame, a navigator, a smart watch, a fitness wristband, a personal digital assistant, or any other product or component having the display function. The display apparatus according to embodiments of the present disclosure may further include but not limited to: a radio frequency unit, a network module, an audio output unit, an input unit, a sensor, a display unit, a user input unit, an interface unit, a memory, a processor, and a power supply, etc. Those skilled in the art can understand that the composition of the above display apparatus does not constitute a limitation on the display apparatus, and the display apparatus may include more or less of the above components, or a combination of some components, or a different arrangement of components.

Evidently those skilled in the art can make various modifications and variations to the present disclosure without departing from the spirit and scope of the present disclosure. Thus the present disclosure is also intended to encompass these modifications and variations therein as long as these modifications and variations to the present disclosure come into the scope of the claims of the present disclosure and their equivalents.

What is claimed is:

1. A display substrate, comprising:

a base substrate;

a plurality of light-emitting devices, arranged in an array on the base substrate;

a black matrix, arranged on a side of a layer where the plurality of light-emitting devices are located facing away from the base substrate, wherein an orthographic projection of the black matrix on the base substrate does not overlap with orthographic projections of the plurality of light-emitting devices on the base substrate, the black matrix comprises a plurality of first openings, and orthographic projections of the plurality of first openings on the base substrate are located within orthographic projections of at least part of gaps between the plurality of light-emitting devices on the base substrate;

a plurality of photosensitive devices, arranged between the layer where the plurality of light-emitting devices are located and the base substrate, wherein orthographic projections of the plurality of photosensitive devices on the base substrate are located within the orthographic projections of at least part of gaps between the plurality of light-emitting devices on the base substrate, and the orthographic projections of the plurality of first openings on the base substrate are located within the orthographic projections of the plurality of photosensitive devices on the base substrate;

a noise reduction layer, arranged between a layer where the plurality of photosensitive devices are located and light emitting surfaces of the plurality of light-emitting devices, wherein an orthographic projection of the noise reduction layer on the base substrate at least overlaps with the orthographic projections of the plurality of photosensitive devices on the base substrate, the noise reduction layer comprises a plurality of second openings, and orthographic projections of the plurality of second openings on the base substrate are located within the orthographic projections of the plurality of photosensitive devices on the base substrate;

wherein each of the plurality of photosensitive devices, each of the plurality of first openings, and each of the plurality of second openings satisfy following relationships:

$$d = X * D_1,$$
$$D_2 = K * D_1,$$
$$\text{and } d = D_1 - (D_1 + D_2) * h_1/(h_1 + h_2 + h);$$

wherein d represents an aperture of the second opening, $D_1$ represents a side length of an orthographic projection of a photoelectric conversion layer comprised in the photosensitive device on the base substrate, $D_2$ represents an aperture of the first opening, $h_1$ represents a distance between a surface of a side of the photosensitive device facing away from the base substrate and a surface of a side of the noise reduction layer facing the base substrate, $h_2$ represents a distance between a surface of a side of the noise reduction layer facing away from the base substrate and a surface of a side of the black matrix facing the base substrate, h represents a thickness of the noise reduction layer in a direction perpendicular to the base substrate, X is greater than 0 and less than or equal to 0.6, and K is greater than 0.7 and less than or equal to 1.

2. The display substrate according to claim 1, wherein the orthographic projections of the plurality of photosensitive devices on the base substrate are located within orthographic projections of at least part of column gaps between the plurality of light-emitting devices on the base substrate.

3. The display substrate according to claim 2, wherein the plurality of light-emitting devices comprise a plurality of first light-emitting devices, a plurality of second light-emitting devices, and a plurality of third light-emitting devices, and a light emitting color of the plurality of first light-emitting devices, a light emitting color of the plurality of second light-emitting devices, and a light emitting color of the plurality of third light-emitting devices are different;

the first light-emitting device, the second light-emitting device, and the third light-emitting device are circularly arranged in a row direction, two adjacent light-emitting devices of a same color in a same rows are spaced by (n−1) light-emitting devices, wherein N is a total number of light emitting colors;

the orthographic projections of the plurality of photosensitive devices on the base substrate are located within orthographic projections of all column gaps at two sides of each of the plurality of second light-emitting devices on the base substrate.

4. The display substrate according to claim 3, wherein a bottom electrode of the photosensitive device comprises a first subsection and a second subsection which are integrally arranged;

wherein the first subsection and the second subsection respectively extend along the column direction;

a width of the first subsection in the row direction is greater than a width of the second subsection in the row direction, and a side of the first subsection away from the second light-emitting device and a side of the second subsection away from the second light-emitting device are located on a same straight line.

5. The display substrate according to claim 4, wherein the bottom electrode of the photosensitive device further comprises a third subsection at a column gap between the second light-emitting device and the first light-emitting device, the third subsection is integrally arranged with the second subsection at an end away from the first subsection, and the third subsection extends along the row direction.

6. The display substrate according to claim 5, further comprising: a plurality of transistors, wherein the plurality of transistors are arranged between the layer where the plurality of photosensitive devices are located and the base substrate;

a first electrode of each of the transistors is electrically connected with the third subsection at the column gap between the second light-emitting device and the first light-emitting device, and the second subsection at the column gap between the second light-emitting device and the third light-emitting device, in one-to-one correspondence.

7. The display substrate according to claim 6, wherein a shape of an orthographic projection of the first electrode of the transistor on the base substrate comprises a first octagon, a second octagon, and a rectangle connected with the first octagon and the second octagon; wherein the first octagon is electrically connected with the bottom electrode of the photosensitive device, and the second octagon is electrically connected with an active layer of the transistor.

8. The display substrate according to claim 6, wherein the plurality of transistors are arranged in an array on the base substrate; active layers of the plurality of transistors in a same row are located on a same straight line, and active layers of the plurality of transistors in a same column are arranged in parallel.

9. The display substrate according to claim 3, wherein the light emitting color of the plurality of first light-emitting devices is blue, the light emitting color of the plurality of second light-emitting devices is green, and the light emitting color of the plurality of third light-emitting devices is red.

10. The display substrate according to claim 1, further comprising a plurality of bias lines, wherein the plurality of bias lines and anodes of the plurality of light-emitting devices are arranged in a same layer, and gaps are arranged between the bias lines and the anodes of the plurality of light-emitting devices.

11. The display substrate according to claim 10, wherein orthographic projections of the plurality of bias lines on the base substrate are located at row gaps between the plurality of light-emitting devices, and one of the plurality of bias lines is electrically connected with a top electrode of the photosensitive device in a same row.

12. The display substrate according to claim 11, wherein the plurality of bias line are lines with a wavy shape.

13. The display substrate according to claim 1, further comprising a pixel defining layer, wherein the pixel defining layer is arranged between a layer where an anodes of the plurality of light-emitting devices are located and light emitting functional layers of the plurality of light-emitting devices, and the pixel defining layer is multiplexed as the noise reduction layer.

14. The display substrate according to claim 1, further comprising a planarization layer, wherein the planarization layer is arranged between the layer where the plurality of light-emitting devices are located and the layer where the plurality of photosensitive devices are located, and the planarization layer is multiplexed as the noise reduction layer.

15. The display substrate according to claim 1, wherein the noise reduction layer and anodes of the plurality of light-emitting devices are arranged in a same layer;

the noise reduction layer comprises a plurality of noise reduction portions, each of the plurality of noise reduction portions is arranged correspondingly to one of the plurality of photosensitive devices, and each of the plurality of noise reduction portions comprises one of the plurality of second openings;

an orthographic projection of one noise reduction portion on the base substrate is larger than an orthographic projection of the photosensitive device corresponding to the one noise reduction portion on the base substrate, and gaps are arranged between the plurality of noise reduction portions and the anodes of the plurality of light-emitting devices.

16. The display substrate according to claim 1, wherein the plurality of photosensitive devices, the plurality of first openings and the plurality of second openings are arranged in one-to-one correspondence.

17. The display substrate according to claim 16, wherein an orthographic projection of a center of one photosensitive device on the base substrate, an orthographic projection of a center of one first opening on the base substrate, and an orthographic projection of a center of one second opening on the base substrate substantially coincide with each other.

18. The display substrate according to claim 1, wherein orthographic projections of photoelectric conversion layers of the plurality of photosensitive devices on the base substrate, the orthographic projections of the plurality of first openings on the base substrate, and the orthographic projections of the plurality of second openings on the base substrate are all rectangles.

19. The display substrate according to claim 18, wherein $D_1$ is greater than or equal to 8 µm and less than or equal to 20 µm, $h_1$ is greater than or equal to 2 µm and less than or equal to 6 µm, $h_2$ is greater than or equal to 10 µm and less than or equal to 20 µm, and h is greater than or equal to 1 µm and less than or equal to 2 µm.

20. A display apparatus comprising the display substrate according to claim 1.

* * * * *